United States Patent [19]

Ahmed

[11] 4,032,839
[45] June 28, 1977

[54] CURRENT SCALING CIRCUITS

[75] Inventor: Adel Abdel Aziz Ahmed, Annandale, N.J.

[73] Assignee: RCA Corporation, New York, N.Y.

[22] Filed: Jan. 2, 1976

[21] Appl. No.: 646,387

[30] Foreign Application Priority Data

Aug. 26, 1975 United Kingdom ............ 35173/75

[52] U.S. Cl. .................. 323/19; 307/297; 323/9; 323/69; 330/30 D
[51] Int. Cl.² ...................... G01K 7/00; G05F 3/08
[58] Field of Search ............ 323/1, 4, 9, 19, 22 T, 323/68, 69; 307/296, 297; 330/30 D, 19

[56] References Cited

UNITED STATES PATENTS

| | | | |
|---|---|---|---|
| 3,617,859 | 11/1971 | Dobkin et al. | 323/4 |
| 3,629,691 | 12/1971 | Wheatley, Jr. | 323/1 |
| 3,831,040 | 8/1974 | Nanba et al. | 307/296 |
| 3,914,683 | 10/1975 | Van De Plassche | 323/4 |

FOREIGN PATENTS OR APPLICATIONS 2,157,756  6/1972  Germany ............................. 323/4

Primary Examiner—Gerald Goldberg
Attorney, Agent, or Firm—H. Christoffersen; S. Cohen; A. L. Limberg

[57] ABSTRACT

Each circuit responds to an input current with an output current in fixed ratio to its input current despite variations in the absolute temperature T at which its input and output transistors are operated. Input current from a two-terminal current regulator of a particular type is employed to develop across a resistance a voltage V which varies as a function of T. The input current passing through the resistance serves as the emitter-to-collector current of the input transistor, which is self-biased. The voltage V is applied between the bases of the input and output transistors of the current amplifier for producing the desired output current at the collector of the output transistor.

25 Claims, 10 Drawing Figures

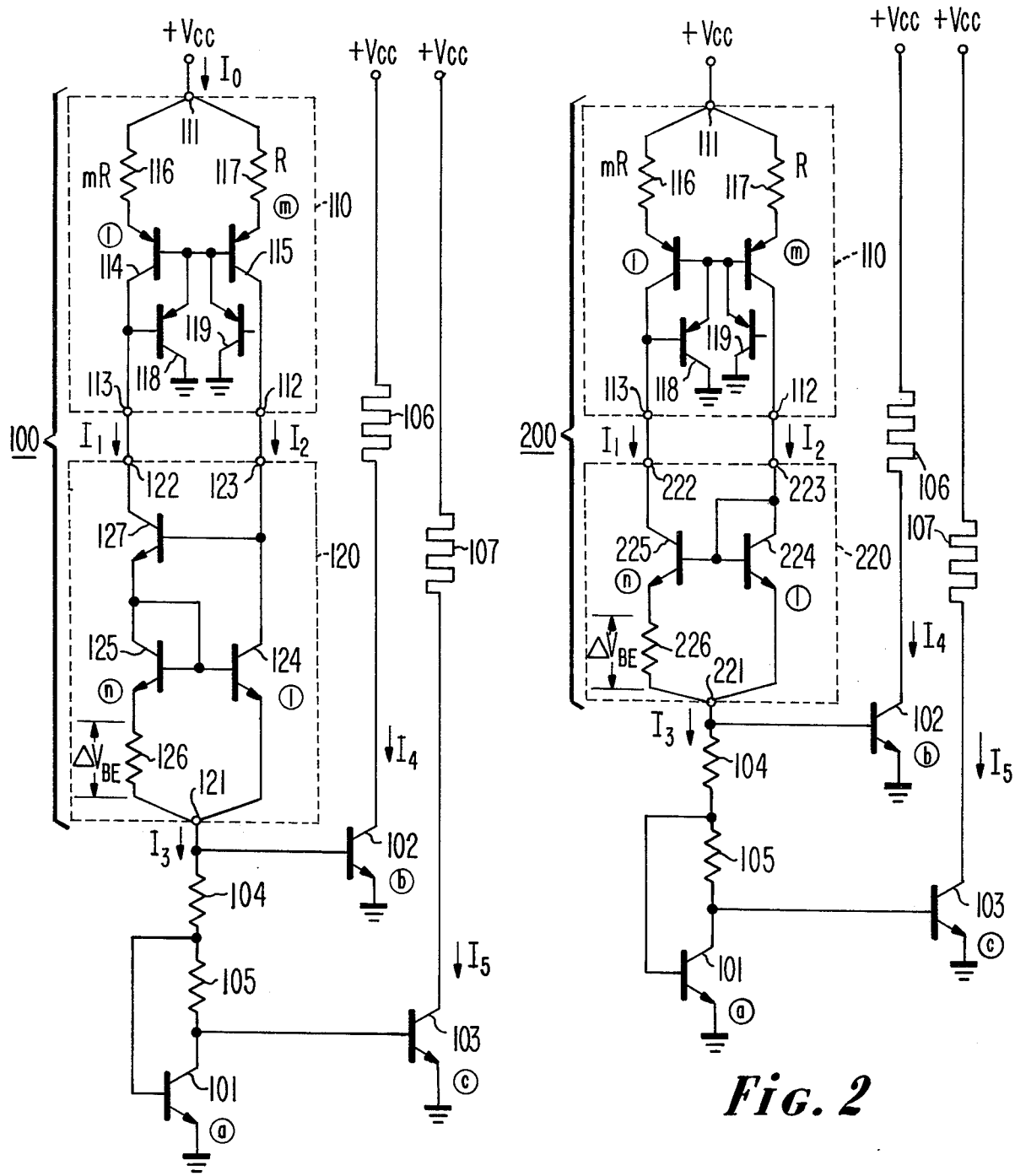

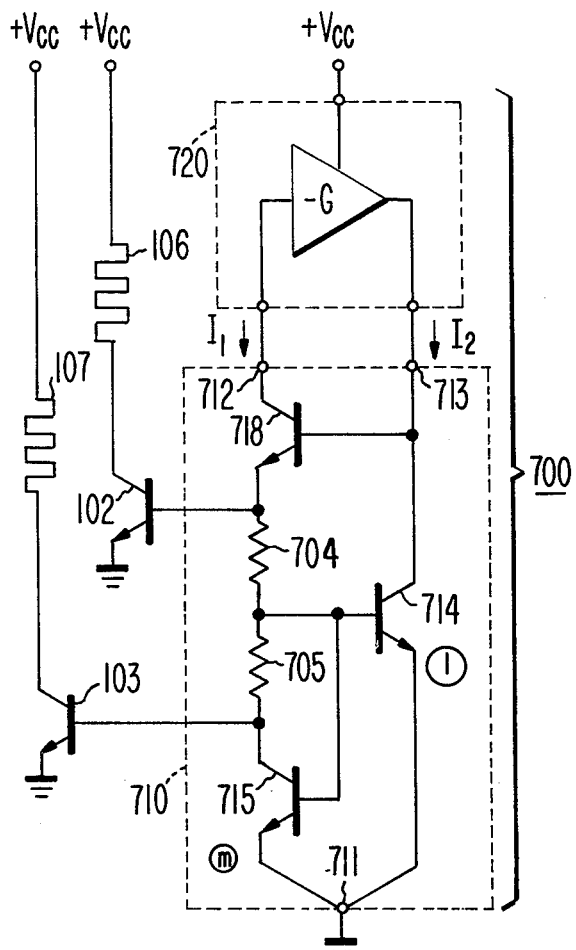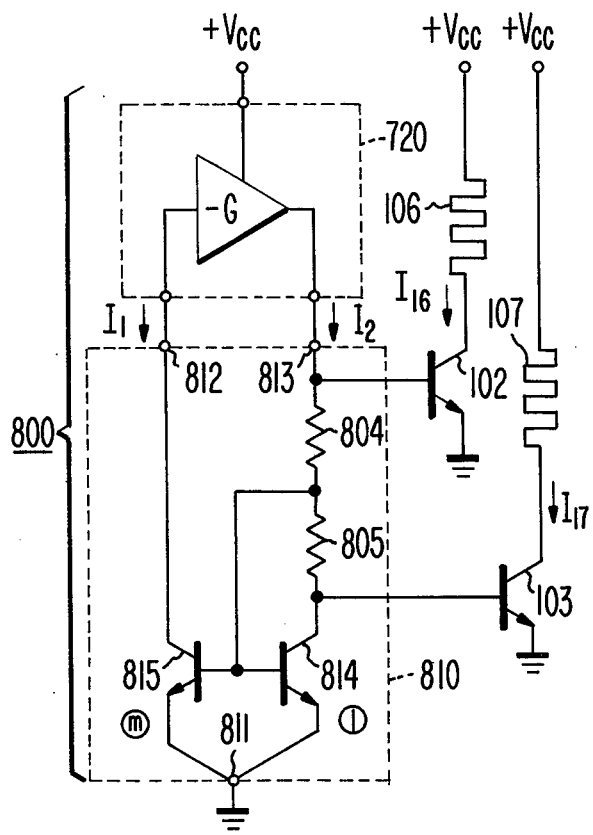
*Fig.7*
*Fig.8*

CURRENT SCALING CIRCUITS

The present invention relates to apparatus for the scaling of currents, which apparatus is readily adapted for construction in monolithic integrated circuit form.

U.S. Pat. No. 3,868,581, issued to the present invention on Feb. 25, 1975 and entitled "Current Amplifier," describes how the relative amplitudes of the collector currents of a pair of grounded-emitter transistors with related transconductance characteristics are maintained in constant proportionality if a potential difference proportional to their absolute operating temperature T is maintained between their respective base electrodes. In that patent, a network of diodes is used to develop this potential difference proportional to T.

In the present invention, a potential difference proportional to T is applied between the base-emitter potentials of a pair of transistors to establish a constant ratio between their collector currrents. The potential difference is developed across a resistance responsive to a current flow therethrough, as determined by a suitable current regulating circuit.

In the drawing:

FIGS. 1-8 are schematic diagrams of current scaling networks, each embodying the present invention;

Figures 3, 4:
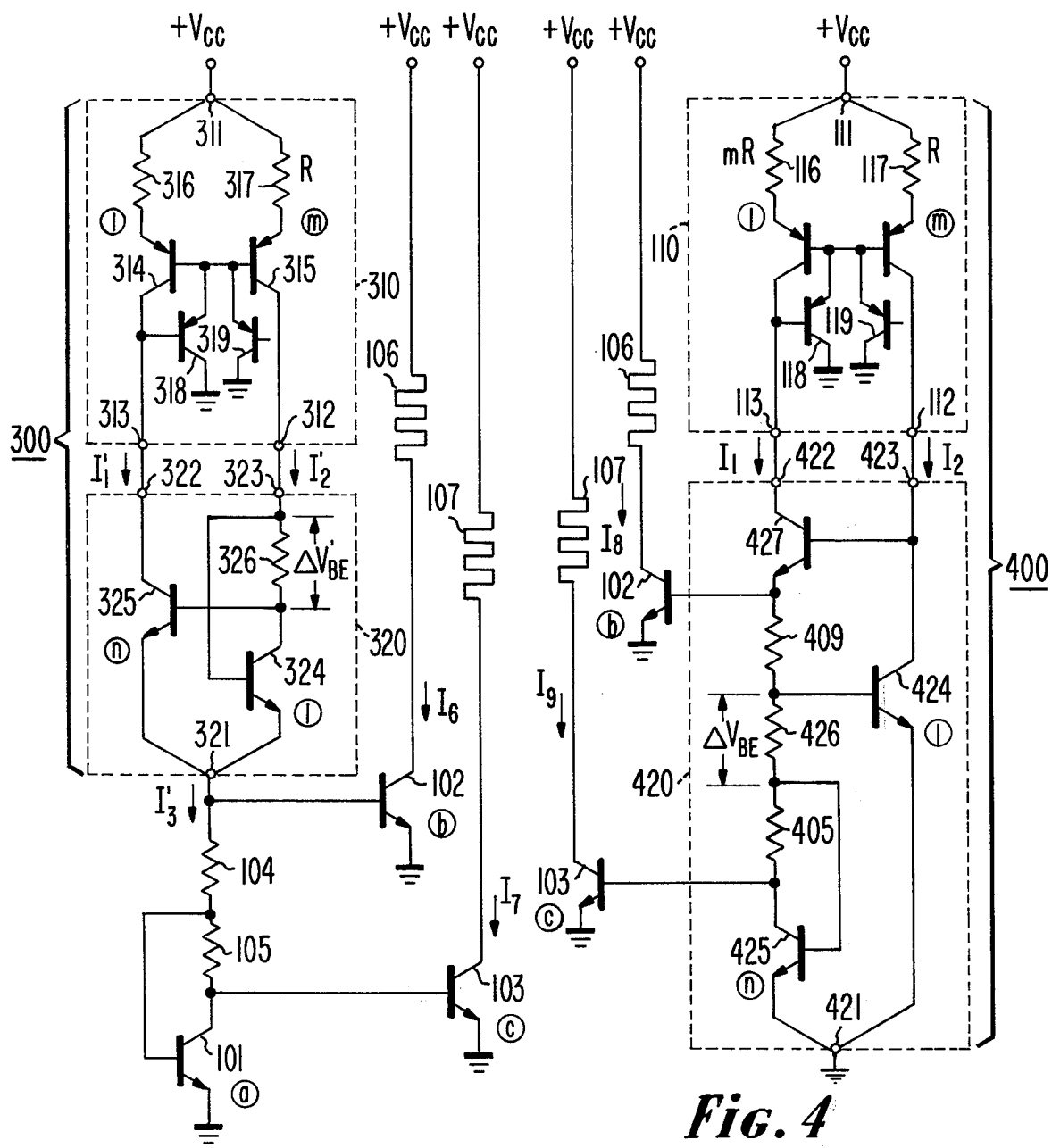

In FIG. 1, the two-terminal current regulator 100 is of a type described by C. F. Wheatley, Jr., in U.S. Pat. No. 3,629,691 issued Dec. 21, 1971 and entitled "Current Source." Transistors 101, 102 and 103 are of the same basic semiconductor material, have identical diffusion or implantation profiles, and are operated at substantially the same absolute temperature T. Transistor 101 is provided with direct coupled collector-to-base feedback to condition it to accept combined collector and base currents equal to the current $I_3$ from regulator 100, except for the portions of $I_3$ diverted as base currents to transistors 102 and 103, which are usually negligibly small. $I_3$ causes potential drops across resistive elements 104 and 105 which are proportional to T, biasing transistor 102 for a collector current $I_4$ larger than but in fixed proportion to $I_3$ despite changing T, and biasing transistor 103 for a collector current $I_5$ smaller than but in fixed proportion to $I_3$ despite changing T.

Current regulator 100 comprises current amplifiers 110 and 120 in regenerative feedback loop connection to regulate the flow of current between their respective common terminals 111 and 121. More particularly, the output terminal 112 of amplifier 110 is direct coupled to the input terminal 123 of amplifier 120; and the output terminal 122 of amplifier 120, to the input terminal 113 of amplifier 110. In the following analysis, base currents are assumed to be negligible, the necessary corrections for complete accuracy being within average skill in the art. So, a current $I_1$ may be presumed to flow from terminal 111 through resistor 116, the emitter-to-collector path of transistor 114, the collector-to-emitter paths of transistors 127 and 125 in that order, and resistor 126 to terminal 121. So, also, a current $I_2$ may be presumed to flow from terminal 111 through resistor 117, the emitter-to-collector path of transistor 115, and the collector-to-emitter path of transistor 124 to terminal 121. The sum $I_3$ of currents $I_1$ and $I_2$ flows from $+V_{cc}$ operating supply to terminal 111 of regulator 100 and from terminal 121 of regulator 100.

Current amplifier 100 is preferably one of that type commonly referred to as a "current mirror amplifier," which has a fixed current gain of $-m$. Its transistors 114 and 115 have base-emitter junction areas in 1 to $m$ ratio, respectively. (In the drawing encircled numbers near the emitter electrodes of similar conductivity type transistors indicate the relative areas of their base-emitter junctions.) The emitter electrodes of transistors 114 and 115 are directly connected to terminal 111 or, as shown, are connected to terminal 111 by resistors 116 and 117 respectively having respective resistances $mR$ and R. As a result of this and of the same potential being applied to their base electrodes, the collector currents of transistors 114 and 115 are in 1 to $m$ ratio, respectively. Transistor 114 is provided with direct coupled collector-to-base degenerative feedback to adjust its base potential to condition it for providing a collector current to terminal 113 substantially equal to the input current $I_1$ demanded at terminal 113, and the same base potential applied to transistor 112 conditions it to supply a collector current $I_2$ related to $I_1$ as follows.

$$I_2 = mI_1 \tag{1}$$

The collector-to-base feedback connection in FIG. 1 comprises a common-collector amplifier transistor 118, but may alternatively consist of a direct connection or comprise some other type of direct coupling.

Current mirror amplifier 120 resembles a well-known current mirror amplifier configuration except that transistor 125 has an emitter degeneration resistor 126 while transistor 124 has no emitter degeneration resistor. Current amplifier 120 can be analyzed viewing transistor 127 as a high-gain current amplifier having its current gain stabilized by emitter-to-base degenerative current feedback applied via the subcombination comprising elements 124, 125 and 126. At low current levels, where the emitter degeneration afforded by resistor 126 is negligible, transistors 124 and 125 behave like a current mirror amplifier with a current gain $-1/n$, as determined by the ratio of the areas of their base-emitter junctions and stabilize the current gain of transistor 127 to $-n$. As current $I_1$ flowing through the collector-to-emitter paths of transistors 127 and 125 and through resistor 126 increases, an appreciable potential drop appears across resistor 126, reducing the collector current of transistor 125 which is required to support the collector current $-I_2$ of transistor 124 and is substantially equal to $-I_1$. This increased gain in its emitter-to-base degenerative current feedback reduces the current gain of transistor 127.

The product mn of the low level current gains of amplifiers 110 and 120 is made larger than unity. An initial current disturbance in the loop (as introduced, for example, by the leakage current of open-base transistor 119) will therefore be regenerated by the loop. Current levels in the loop continue to grow until the current gain of amplifier 120 is reduced to $-1/m$ so the current gain in the loop connection of amplifiers 110 and 120 is unity. The resultant equilibrium condition is associated with a particular value $\Delta V_{BE}$ of the potential drop $V_{126}$ across resistor 126, as defined by the difference in the base-emitter potentials of transistors 124 and 125.

The general expression for the base-emitter junction potential of a transistor is as follows.

$$V_{BE} = (kT/q) \ln (I_E/AJ_S) \tag{2}$$

where
- $V_{BE}$ is the base-emitter potential of the transistor,
- $k$ is Boltzmann's constant,
- $T$ is absolute temperature of the transistor base-emitter junction,
- $Q$ is the charge on an electron,
- $I_E$ is the emitter current of the transistor,
- $A$ is the area of the transistor base-emitter junction, and
- $J_S$ is the emitter current density during saturation of the transistor.

Numerical subscripts for these quantities relate them to the transistor having that identification numeral. Transistors 124 and 125 are assumed to be of the same basic semiconductor material and to have similar diffusion or implantation profiles so $J_{S124} = J_{S125}$. Transistors 124 and 125 are operated at substantially the same absolute temperature T. Equation 3 follows from Kirchoff's Law of Potentials.

$$\Delta V_{BE} = V_{BE124} - V_{BE125} \tag{3}$$

Neglecting the base currents of transistors 124 and 125 in the substitution of equations 1 and 2 into equation 3.

$$\Delta V_{BE} = (kT/q) \ln mn \tag{4}$$

Knowing the resistance $R_{126}$ of resistor 126 one uses Ohm's Law to calculate the value of $I_1$ flowing therethrough to cause the $\Delta V_{BE}$ drop.

$$I_1 = \Delta V_{BE}/R_{126} = (kT/q\, R_{126})\ln mn \tag{5}$$
$$I_2 = mI_1 = (mkT/q\, R_{126})\ln mn \tag{6}$$
$$I_3 = I_1 + I_2 = (m+1)(kT/q\, R_{126})\ln mn \tag{7}$$

Equation 6 is obtained by combining equations 1 and 5; and equation 7 from Kirchoff's Law of Currents.

It is important to recognize at this point in the analysis, that any of the currents $I_1$, $I_2$ and $I_3$ exhibit a temperature dependency such that, were any one of them applied to a resistor whose resistance varies with temperature in the same way as the resistance $R_{126}$, and experiencing the same temperature as resistor 126, the potential drop across that resistor would be directly proportional to $\Delta V_{BE}$ and thus to T. $V_{104}$ is such a potential drop across resistor 104 with resistance $R_{104}$, and $V_{105}$ is such a potential drop across resistor 105 with resistance $R_{105}$. The values of $V_{104}$ and $V_{105}$ can be determined by Ohm's Law and substitution from equation 7.

$$V_{104} = I_3 R_{104} = (m+1)(R_{104}/R_{126})(kT/q)\ln mn \tag{8}$$

$$V_{105} = I_3 R_{105} = (m+1)(R_{105}/R_{126})(kT/q)\ln mn \tag{9}$$

Kirchoff's Law of Potential gives rise to equations 10 and 11.

$$V_{BE101} + V_{104} = V_{BE102} \tag{10}$$

$$V_{BE101} - V_{105} = V_{BE103} \tag{11}$$

Substituting equations 1 and 8 into equation 10 and simplifying yields equation 12, and substituting equations 1 and 8 into equation 11 and simplifying yields equation 13.

$$I_4 = (b/a)(mn)^{(m+1)R_{104}/R_{126}} I_3 \tag{12}$$

$$I_5 = (c/a)(mn)^{-(m+1)R_{105}/R_{126}} I_3 \tag{13}$$

Equations 12 and 13 express the proportionalities between the current $I_3$ provided by the current regulator and the respectively larger and smaller currents $I_4$ and $I_5$ flowing as the collector currents of transistors 102 and 103, respectively. There is no temperature term in either equation 12 or 13. This points up a most significant aspect of the present invention, namely that the output currents $I_4$ and $I_5$ obtained remain in a fixed ratio to the current $I_3$ despite temperature change, even though the parameters of the circuit elements used to determine the currents $I_4$ and $I_5$ are temperature dependent. Since $m$ appears in the exponent of equations 4 and 5, in making $mn$ larger than unity, it is advisable to make $m$ the larger factor where it is desired to make the ratio of $I_4$ to $I_3$ or of $I_3$ to $I_5$ quite large without making the ratio of $R_{105}$ to $R_{126}$ larger than a few times. Ratios of $I_4$ and $I_3$ cannot be achieved accurately when these ratios come near to the common-emitter forward current gain $h_{fe102}$ of transistor 102 because the base current of transistor 102 will no longer be negligible. This problem can be surmounted by making transistors 101 and 102 composite transistors comprising similar Darlington cascade configurations of single transistors. Alternatively, transistors 101 and 102 can be of a super-beta type with narrow base widths, in which case it is advisable to make transistors 124 and 125 super-beta type also. Suitable arrangements should be made to maintain fixed low emitter-to-collector potentials on the super-beta transistors such as inserting a diode between the base electrode of transistor 127 and the collector electrode of transistor 124 and inserting into the collector circuit of transistor 102 a common-base amplifier transistor with base electrode biased in common with those of transistors 124 and 125. Large ratios of $I_3$ to $I_5$ can be obtained without running into errors caused by base currents, and the present invention is a particularly attractive way to obtain currents in the sub-microampere region without resort to resistance values that are too large to be readily integrated.

FIG. 2 shows alternative apparatus to that of FIG. 1 wherein a novel current regulator 200 replaces current regulator 100. Current amplifier 220 of regulator 200 is of simpler structure than current amplifier 120 of regulator 100. At low current levels, current amplifier 220 resembles a simple current mirror amplifier structure and has a current gain of $-n$ because of the proportioning between the base-emitter junction areas of transistors 225 and 224. At higher current levels the gain of the current amplifier comprising elements 224, 225 and 226 falls, rather than rising, as does the FIG. 1 subcombination current amplifier, consisting of elements 124, 125 and 126. This, inasmuch as resistor 226 degenerates the transconductance of the output transistor 225, of current amplifier 220, whereas resistor 126 degenerates the transcoductance of the input of transistor 125 of current amplifier 120. At equilibrium, the current gain of amplifier 220 is reduced to $-1/m$ and equations similar to equations 5, 6, 7, 12 and 13 except for $R_{126}$ being replaced by $R_{226}$, the resistance of resistor 226, describe the operation of the FIG. 2 apparatus.

FIG. 3 shows another current regulator 300 which will supply a current $I_3'$ of the sort desired to cause $V_{104}$ and $V_{105}$ to vary in direct proportion to the absolute temperature T, close to which the circuit transistors are operated. Regulator 300 comprises the regenerative loop connection of current amplifiers 310 and 320. A current $I_1'$ flows from the common terminal 311 of amplifier 310 through resistor 316, the emitter-to-collector path of transistor 314, the interconnected input terminal 313 of amplifier 310 and output terminal 322 of amplifier 320, and the collector-to-emitter path of transistor 325 to the common terminal 321 of amplifier 320. A current $I_2'$ flows from the common terminal 311 of amplifier 310 through resistor 317, the emitter-to-collector path of transistor 315, the interconnected output terminal 312 of amplifier 310 and output terminal 323 of amplifier 320, resistor 326, and the collector-to-emitter path of transistor 324 to the common terminal 321 of amplifier 320.

$$I_3' = I_1' + I_2' \tag{14}$$

That is, $I_3'$ is the sum of the currents $I_1'$ and $I_2'$ flowing from terminal 321.

When $I_1'$ and $I_2'$ are sufficiently low in level, the potential drops across resistors 316, 317 and 326 are negligible, less than a millivolt or so, and current amplifiers 310 and 320 behave like the well-known current mirror amplifier configurations that would obtain were resistors 316, 317 and 318 replaced by direct connections. that is, current amplifiers 310 and 320 exhibit current gains of $-m$ and $-n$, respectively, the product of which is made greater than unity so current levels tend to increase by regeneration. The current gain $-G$ of amplifier 320 falls as its input current $I_2'$ increases, causing a larger potential drop $V_{326}$ across resistor 326. This reduces the base potential of transistor 325 relative to that of transistor 324, diminishing the collector current $I_1'$ of transistor 325 relative to the collector current $I_2'$ of transistor 324. Further reduction of G is forestalled when $-G$ equals $1/(-H)$, $-H$ being the current gain of amplifier 310 for the equilibrium values of $I_1'$ and $I_2'$.

While current amplifier 310 may be a current mirror amplifier, with the resistance of resistor 316 being $m$ times the resistance R of resistor 317, current regulator 300 exhibits better current regulation characteristics if the resistance of resistor 316 is made rather small or indeed is replaced by direct connection without substantial resistance. Nevertheless, if the difference in potential drop across resistor 317 and that appearing between terminal 311 and the emitter electrode of transistor 314 is to be kept smaller than 100 millivolts or so for the planned equilibrium values of $I_1'$ and $I_2'$, an equilibrium value $H_e$ of H can be confidently predicted. An equilibrium value $\Delta V_{BE}'$ of $V_{326}$, which varies in proportion to $T_1$ can be determined proceeding from the following observation in accordance with Kirchoff's Law of Potentials.

$$\Delta V_{BE}' = V_{BE324} - V_{BE325} \tag{15}$$

At equilibrium equation 16 obtains.

$$I_2' = H_e I_1' \tag{16}$$

Substitution of equations 1 and 16 into equation 15 yields equation 17.

$$\Delta V_{BE}' = (kT/q)\ln H_e n \tag{17}$$

Equations 14 and 17 and Ohm's Law yields the following equations 18–20.

$$I_2' = \Delta V_{BE}'/R_{326} = (kT/q\, R_{326})\ln H_e n \tag{18}$$

$$I_1' = (I_2'/H_e) = (kT/q\, H_e\, R_{326})\ln H_e n \tag{19}$$

$$I_3' = I_2' + I_1' = [(H_e+1)/H_e]\,(kT/q\, R_{326})\ln H_e n \tag{20}$$

Equations 21 and 22 are determined by Ohm's Law and equation 20.

$$V_{104} = I_3'\, R_{104} = [(H_e+1)/H_e](R_{104}/R_{326})\,(kT/q)\ln H_e n \tag{21}$$

$$V_{105} = I_3'\, R_{105} = [(H_e+1)/H_e](R_{105}/R_{326})\,(kT/q)\ln H_e n \tag{22}$$

Substituting equations 21 and 22 into equations 10 and 11, respectively, together with equation 1 yields equations 23 and 24.

$$I_6 = (b/a)\,(H_e n)^{[(H_e+1)/H_e](R_{104}/R_{326})}\,I_3' \tag{23}$$

$$I_7 = (c/a)\,(H_e n)^{-[(H_e+1)/H_e](R_{105}/R_{326})}\,I_3' \tag{24}$$

The FIG. 3 apparatus is advantageous in that the $(H_e+1)H_e$ factor affects the value of the exponents in equations 23 and 24 less than the $(m+1)$ factor affects the value of the exponents in equations 12 and 13. This makes the scaling of currents less dependent upon the current gains of the current amplifiers 310, 320 being invariant with temperature change. On the other hand, larger ratios between $R_{326}$ and each of $R_{104}$ and $R_{105}$ are necessary where it is desired to make $I_4'/I_3'$ and $I_3'/I_2'$ larger ratios, as compared to the ratios between $R_{126}$ and each of $R_{104}$ and $R_{105}$ to make $I_4/I_3$ and $I_3/I_2$ similarly larger ratios.

FIG. 4 shows current scaling apparatus employing a current regulator 400 similar to current regulator 100 except for (a) the serial connection of self-biased transistor 125 and resistor 126 being replaced by the reversed-order serial connection of resistor 426 and self-biased transistor 425 and (b) the inclusion of resistors 405 and 409. These alterations do not change the basic operation of the regulator; elements 421–427 of current amplifier 400 operate substantially the same as elements 121–127 of current amplifier 100 insofar as current regulation is concerned. Self-biased transistor 425, in addition to performing the function of self-biased transistor 125, simultaneously performs a similar function to that of self-biased transistor 101. The following equations, descriptive of the operation of the FIG. 4 configuration, can be derived proceeding from the following observation according to Kirchoff's Law of Potentials.

$$\Delta V_{BE} = V_{BE424} - V_{BE425} \tag{25}$$

Substituting equations 1 and 2 into equation 25 yields equation 26.

$$\Delta V_{BE} = (kT/q)\ln mn \tag{26}$$

Knowing the resistance 426 of resistor 426 one uses Ohm's Law to calculate $I_1$.

$$I_1 = \Delta V_{BE}/R_{426} = (kT/q\ R_{426})\ln mn \qquad (27)$$

The potential drops $V_{405}$ across resistor 405, having resistance $R_{405}$, and the sum of $V_{426} + V_{404}$ of the respective potential drops across resistors 426 and 409, the latter having resistance $R_{409}$ is calculable from Ohm's Law and equation 27.

$$V_{405} = (R_{405}/R_{426})\ (kT/q)\ln mn \qquad (28)$$
$$V_{426} + V_{409} = [(R_{426} + R_{409})/R_{426}](kT/q)\ln mn \qquad (29)$$

Kirchoff's Law of Potentials gives rise to equations 30 and 31.

$$V_{BE423} + V_{426} + V_{409} = V_{BE102} \qquad (30)$$
$$V_{BE425} - V_{405} = V_{BE103} \qquad (31)$$

Substituting equations 1, 7 and 27 into equation 30 yields equations 32, and substituting equations 1, 7 and 28 into equation 31 yields equation 33.

$$I_u = [(b/n)\ (m+1)]^{(R_{426} + 409)/R_{426}}\ I_3 \qquad (32)$$

$$I_v = [(c/n)\ (m+1)]\ mn^{-IR_{405}/R_{426}}\ I_3 \qquad (33)$$

Figure 5:
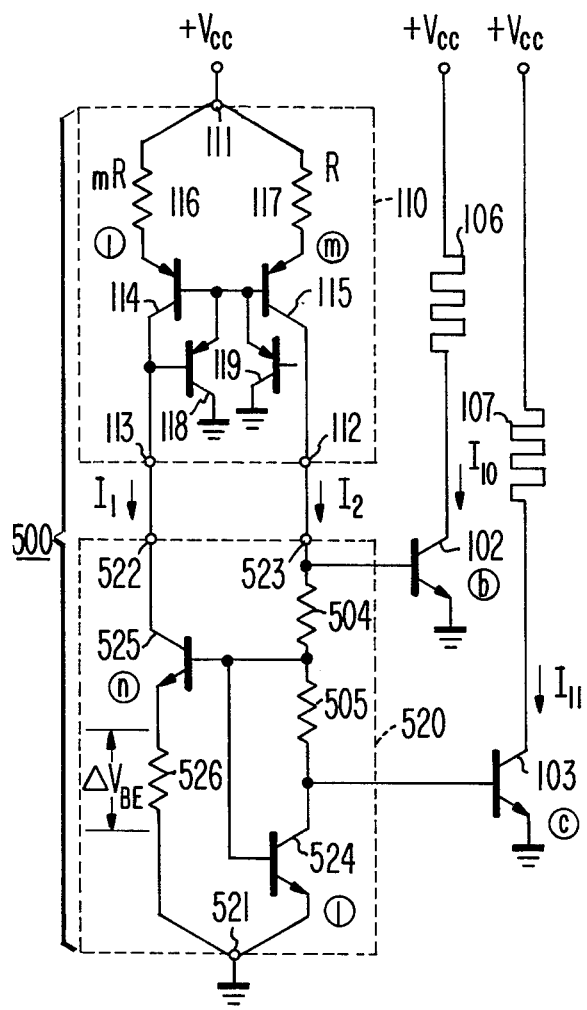

FIG. 5 shows a current scaling apparatus using a current regulator 500 similar to current regulator 200 except for the inclusion of resistors 504 and 505 in the $I_2$ current path, which does not appreciably affect current regulation. Self-biased transistor 524 not only replaces self-biased transistor 224, however, but also is active in causing the configuration including elements 504, 505, 525 to respond to $I_2$ analogously to the way in which the configuration comprising elements 101, 104, 105 of the earlier FIGURES responds to $I_3$. Accordingly, it can be shown that the collector currents $I_{10}$ and $I_{11}$ of transistor 102 and of transistor 103, respectively, conform substantially to the following equations, where $I_3$ is the sum of $I_1$ and $I_2$.

$$I_{10} = [bm/(m+1)]\ (mn)^{(R_{504}/R_{526})}\ I_3 \qquad (34)$$
$$I_{11} = [cm/(m+1)]\ (mn)^{-(R_{505}/R_{526})}\ I_3 \qquad (35)$$

Comparing the current scaling apparatuses of FIGS. 4 and 5, respectively, it will be seen that the former is better suited to developing relatively low-value output currents and the latter is better suited to developing relatively high-value output currents.

Figure 6:
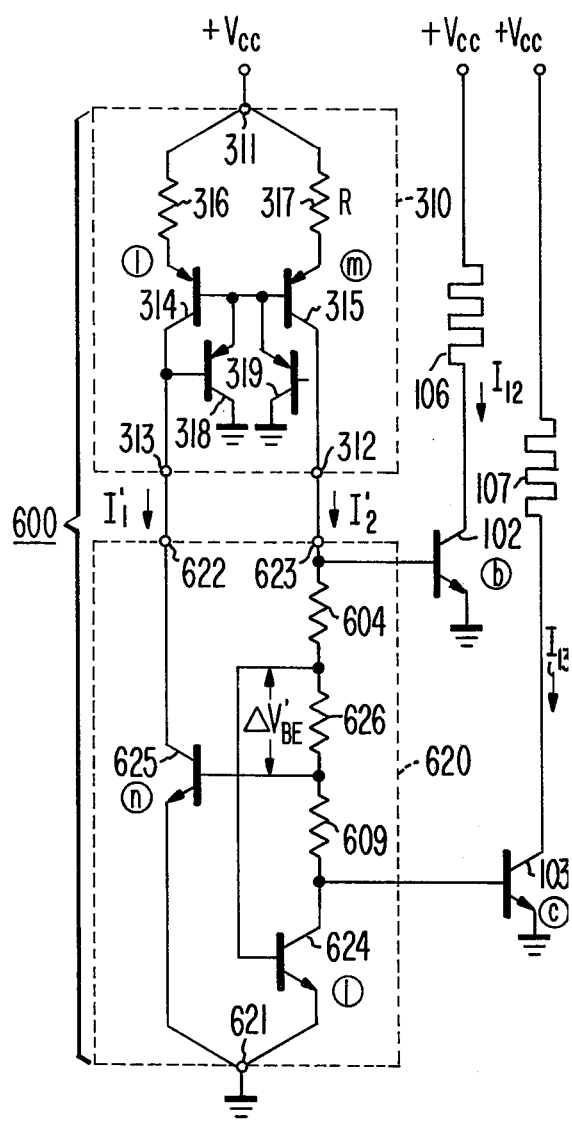

FIG. 6 shows a current scaling apparatus using a current regulator 600 similar to current regulator 300 except for the inclusion of resistors 604 and 609 in the $I_2'$ current path. The basic operation of the regulator is substantially unaffected by this. Self-biased transistor 624 and resistor 626, in addition to performing the respective functions of self-biased transistor 324 and of resistor 326 perform in conjunction with resistors 604 and 609 to respond to $I_1'$ similarly to the self-biased transistor 101 and resistors 104 and 105 respond to $I_3'$. Accordingly, it can be shown that the collector currents $I_{12}$ and $I_{13}$ respectively of transistor 102 and of transistor 103 are related to $I_3'$, the sum of $I_1'$ and $I_2'$, in the following ways.

$$I_{12} = b\ (H_r n)^{(R_{604}/R_{626})}\ I_3' \qquad (36)$$
$$I_{13} = c\ (H_r n)^{-(R_{609} + R_{626})/R_{626}}\ I_3' \qquad (37)$$

FIG. 7 shows $I_1$, the output current of a current mirror amplifier 710 and the input current of a current amplifier 720, being applied to measuring resistors 704, 705 to obtain potential drops, both offset from the base-emitter offset potential $V_{BE715}$ of self-biased transistor 715 though in opposite polarities. Current amplifier 720 is an analogous structure to any one of amplifiers 120, 220, 320 although it is constructed using transistors of the opposite polarity type. Consequently, $I_1$ is proportional to the absolute temperature T of these transistors divided by a resistance function, and when applied to resistors 704 and 705 develops the potential drops with desired characteristics of being proportional to T. Except for resistors 704 and 705 replacing direct connection, amplifier 710 is a well-known type of current mirror amplifier and introduction of these resistors does not interfere with its current mirror amplifier operation.

FIG. 8 shows $I_2$, the output current of a current amplifier 720 and the input current of a current mirror amplifier 820, being applied to measuring resistors 804, 805 to obtain potential drops, both offset from the base-emitter potential $V_{BE814}$ of self-biased transistor 814 though in opposite polarities. Since $I_2$ is proportional to the absolute temperature T of transistors in amplifier 720 divided by a resistance function, its flow through resistors 804 and 805 develops potential drops across them which are proportional to T. Except for resistors 804 and 805, amplifier 810 is the well-known simple current mirror amplifier configuration, and introduction of these resistors does not interfere with its operation.

FIGS. 1 – 8 all show a transistor 102 biased to demand a relatively high collector current and a transistor 103 biased to demand a relatively low collector current. The embodiments of the invention are illustrated in this manner so as to use as few figures as possible. In actuality, these configurations will often be constructed in alternative forms where (a) only transistor 102 is used and resistive element 105 may be replaced by direct connection and (b) only transistor 103 is used and resistive element 104 may be replaced by direct connection. In the latter case, the positions of self-biased transistor 101 and resistive element 104 in their series connections may be reversed without affecting operation. However, where a pair of proportional current sources or sinks are required, it is in the interest of accuracy to scale these currents one up and one down from the current regulator currents. The current scaling technique is more powerful when scaling down from currents in the current regulator than when scaling up; larger scaling ratios can be achieved without running into problems caused by transistor base currents. In FIGS. 1–3, regulators 100, 200, 300 may be constructed using transistors of opposite conductivity type from that shown with the connections common to the rest of the circuitry to terminals of the current regulators being reversed. Current mirror amplifier 110 can be replaced with any of a variety of other current mirror amplifiers including one comprising a dual-collector transistor with one of its collector electrodes connected back to its base electrode. Amplifier 310 may be replaced by any of a variety of current mirror amplifiers, with or without modifications of the sort described in connection with amplifier 310. Transistors 127 and 427 can be replaced by field effect transistors in amplifiers 120 and 420. Either of current amplifiers 710 and 810 can be replaced by one of a variety of current mirror amplifiers modified in a similar way as amplifier 710 or 810 is over a known current mirror amplifier configuration.

Using the combined current flows $I_1$ and $I_2$ (or $I_1'$ and $I_2'$) of a current regulator to develop a substantial potential drop across resistors, which is equal to the difference between the base-emitter potentials of a pair of transistors and is therefore proportional to the operating temperatures of the transistors, is a useful concept in connection with other integrated circuit problems. For example, such a drop can be added to the base-emitter offset potentials of a plurality of self-biased transistors to obtain a reference potential which exhibits substantially no change with temperature.

Figure 9:
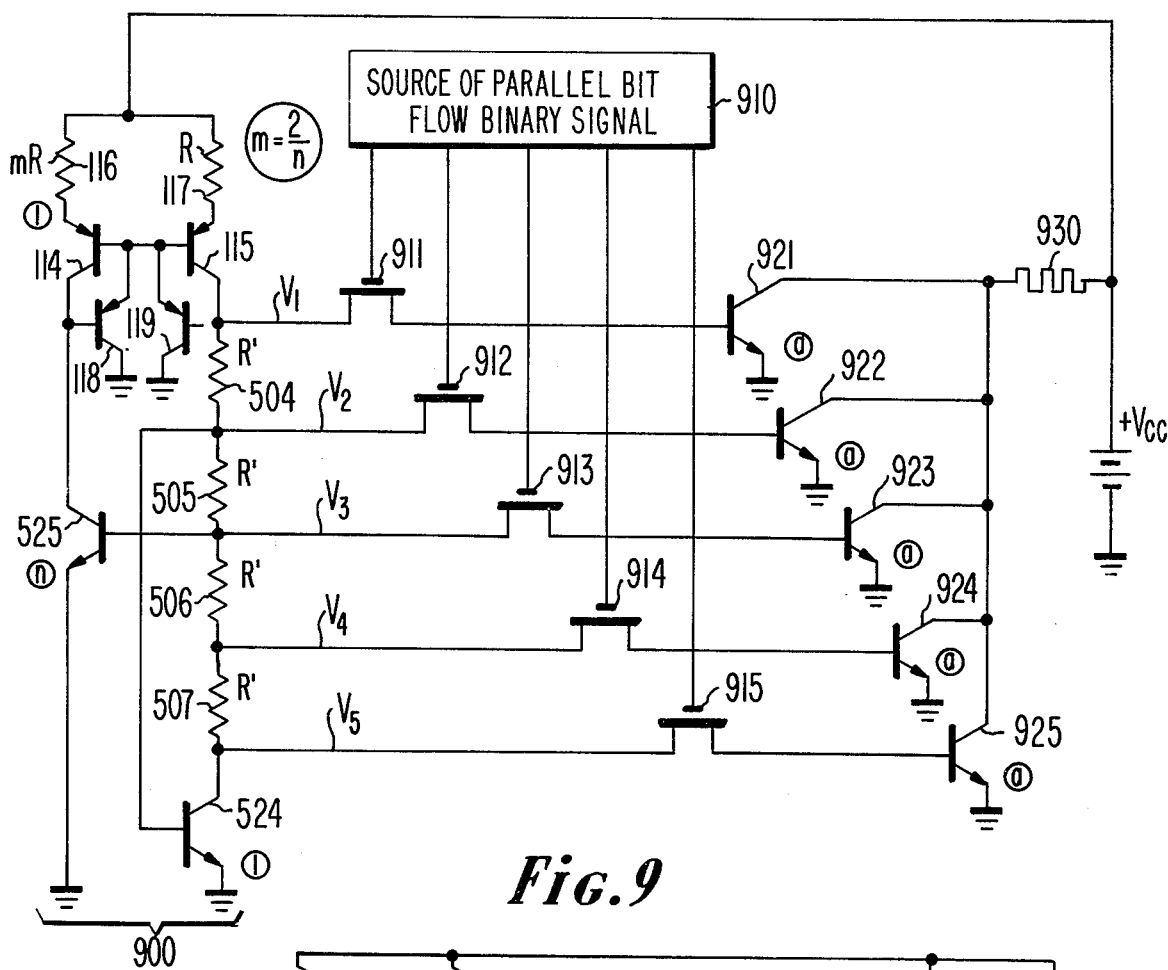
FIG. 9 is a schematic diagram partially in block form of a digital-to-analog conversion apparatus wherein current scaling is carried out in accordance with the present invention.

The FIG. 9 digitial-to-analog converter uses a current regulator 900 similar to current regulator 500 to develop potential drops of $(kT/q)\ln 2$ across each of resistors 504–507, which have identical resistances R'. These drops add to or subtract from the base-emitter offset potential of transistor 524 to provide a series of offset potentials $V_1$, $V_2$, $V_3$, $V_4$, $V_5$. Each of the five bits of a parallel-bit-flow binary signal from a source 910 thereof controls the conduction or non-conduction of one of the field-effect transistors 911, 912, 913, 914, 915 used as transmission gates for selectively applying potentials $V_1$, $V_2$, $V_3$, $V_4$, $V_5$, respectively, as base potentials to transistors 921, 922, 923, 924, 925, respectively. Responsive to the application of these base potentials, transistors 921, 922, 923, 924, 925 supply collector currents with respective weights in ratio 16:8:4:2:1 respectively to a common load resistor 930. Current regulator 900 may, of course, be replaced by a modified form of any of the current regulators 100, 200, 300, 400, 600, 700 or 800.

Figure 10:
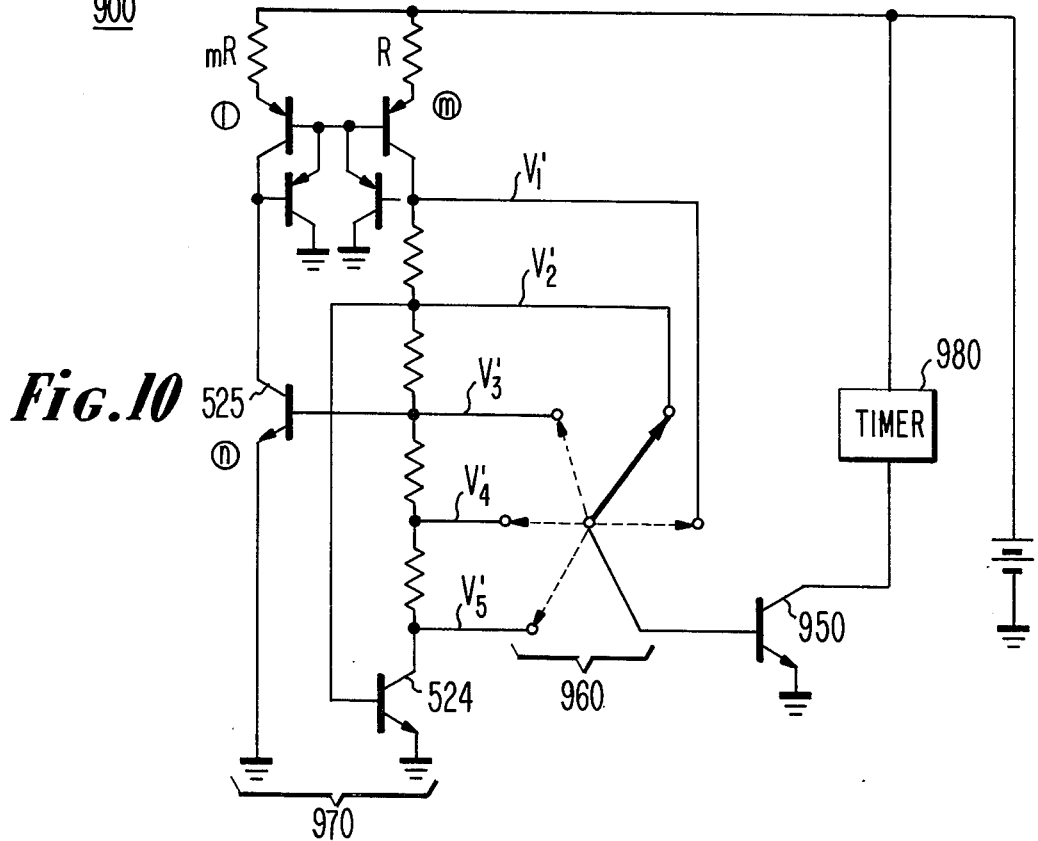
FIG. 10 is a schematic diagram, partially in block form, of a timer apparatus wherein current scaling is carried out in accordance with the present invention.

FIG. 10 shows a transistor 950 having its base electrode selectively connected by means of a switch 960 to one of the potentials $V_1'$, $V_2'$, $V_3'$, $V_4'$, $V_5'$ developed by a current scaling apparatus 970 of a sort similar to one of these shown in FIGS. 1–8. This enables selection amongst several values of collector current for a transistor 950. The selected current is useful, for example, for application to a timer 980 which can be of the type described by Campbell in U.S. Pat. No. 3,808,466 issued Apr. 30, 1974, and entitled "Capacitative-Discharge Timing Circuit Using Comparator Transistor Base Current To Determine Discharge Rate."

What is claimed is:

1. In combination:
   an input transistor and an output transistor, each having base and emitter electrodes with a base-emitter junction therebetween and each having a collector electrode, both arranged for operation at substantially the same absolute temperature T;
   first and second resistances in substantially fixed ratio with each other despite change in their operating temperatures, said first resistance being serially connected with the base-emitter junction of a first of said input and output transistors to form a first series combination, said first series combination being connected in parallel with the base-emitter junction of the second of said input and said output transistors to form a first parallel combination;
   means responsive to said absolute temperature T for applying a potential proportional to T across said second resistance to cause a first current flow therethrough;
   means responsive to said first current for supplying a second current, which is a substantially constant factor times said first current and is applied as an input current to said first parallel combination;
   means for applying direct-coupled collector-to-base feedback to said input transistor to self-bias said input transistor, including a direct coupling of the collector electrode of said input transistor to the base electrode of said first transistor, for causing substantially the entire said input current to flow through said first resistance and through the collector-to-emitter path of said input transistor, developing a potential drop across said first resistance, which potential drop is proportional to T and determines the difference between the base-emitter potentials of said input and output transistors; and
   means for utilizing the collector current flow of said output transistor as an output current, which output current is in substantially fixed proportion to said input current despite changes in T.

2. A combination as set forth in claim 1 wherein said means responsive to said absolute temperature T for applying a potential proportional to T across said second resistive means, and said means for supplying a second current to said first parallel combination together comprise:
   third and fourth transistors of the same conductivity type as each other, each having base and emitter electrodes with a base-emitter junction therebetween and having a collector electrode and each being operated at substantially said absolute temperature T;
   means for applying the emitter-to-collector potential of said third transistor across its base-emitter junction, thereby making it a self-biased transistor, which self-biased transistor is serially connected with said second resistance to form a second series combination, said second series combination being connected in parallel with the base-emitter junction of said fourth transistor to form a second parallel combination;
   a fifth transistor of said first conductivity type having an input electrode to which the collector electrode of said fourth transistor is direct coupled, and having a principal conduction path between a common electrode and an output electrode, said common electrode being connected to the base electrode of said fourth transistor; and
   a current amplifier having an input terminal to which the output electrode of said fifth transistor is direct coupled, having a common terminal, and having an output terminal direct coupled to the input electrode of said fifth transistor;
   a connection of the common terminal of said current amplifier to one end of said first parallel combination; and
   a connection of the emitter electrode of said fourth transistor to the other end of said first parallel combination.

3. A combination as set forth in claim 1 wherein said means responsive to said absolute temperature T for applying a potential proportional to T across said second resistance, and said means for supplying a second current applied to said first parallel combination together comprise:
   third and fourth transistors of the same conductivity type as each other, each having base and emitter electrodes with a base-emitter junction therebetween and having a collector electrode, each operated at substantially said absolute temperature T, and said second resistance being connected between the emitter electrodes of said third and fourth transistors;

means direct coupling the collector electrode of said third transistor to each of the base electrodes of said third and fourth transistors; and a current amplifier having an input terminal to which the collector electrode of said fourth transistor is direct coupled, having a common terminal, and having an output terminal direct coupled to the collector electrode of said third transistor;

a connection of the common terminal to one end of said first parallel combination; and a connection of the emitter electrode of said third transistor to the other end of said first parallel combination.

4. A combination as set forth in claim 1 wherein said means responsive to said absolute temperature T for applying a potential proportional to T across said second resistance, and said means for supplying a second current applied to said first parallel combination together comprise:

third and fourth transistors of the same conductivity type as each other, each having base and emitter electrodes with a base-emitter junction therebetween and having a collector electrode, each being operated at substantially said absolute temperature T, and said second resistance being connected at a first end thereof to the base electrode of said third transistor and at the second end thereof to the collector electrode of said third transistor and the base electrode of said fourth transistor;

a node between the emitter electrodes of said third and fourth transistors to which each of their emitter electrodes is directly connected without substantial intervening impedance;

a current amplifier having an input terminal to which the collector electrode of said fourth transistor is direct coupled, having a common terminal, and having an output terminal direct coupled to the first end of said second resistance;

a connection of the common terminal of said current amplifier to one end of said first parallel combination; and a connection of the node between the emitter electrodes of said third and said fourth transistor to the other end of said first parallel combination.

5. A combination as set forth in claim 1 wherein said input and output transistors are of the same conductivity type, said input transistor is said second transistor, said output transistor is said first transistor, the emitter electrodes of said input and said output transistors are directly connected without substantial intervening impedance to a point of reference potential, said first resistance has a first end connected to the base electrode of said input transistor and a second end connected to the base electrode of said output transistor, said means for applying direct-coupled collector-to-base feedback to said input transistor thereby including said first resistance, whereby the collector current of said output transistor is smaller than said collector current of said input transistor by a factor substantially equal to said substantially fixed proportion.

6. A combination as set forth in claim 5 wherein said means responsive to said absolute temperature T for applying a potential proportional to T to said second resistance, and said means for supplying a second current applied to said first parallel combiation together comprise:

said second resistance having a first end connected to the first end of said first resistance and having a second end, so that said second current is related to said first current by a substantially constant factor close to unity;

a third transistor of said same conductivity type having base and emitter electrodes with a base-emitter junction therebetween, having a collector electrode, and being operated at a temperature substantially equal to T, the emitter electrode of said third transistor being connected to said point of reference potential and its base electrode being connected to the second end of said second resistance;

a fourth transistor of said same conductivity type having an input electrode to which the collector electrode of said third transistor is direct coupled and having a principal conduction path between an output electrode and a common electrode, its common electrode being direct coupled to the second end of said second resistance; and a current amplifier having an input terminal to which the output electrode of said fourth transistor is direct coupled and having an output terminal direct coupled to the collector electrode of said third transistor.

7. A combination as set forth in claim 5 wherein said means responsive to said absolute temperature T for applying a potential proportional to T across said second resistance, and said means for supplying a second current applied to said first parallel combination together comprise:

a third transistor of said same conductivity type, having base and emitter electrodes with a base-emitter junction therebetween, having a collector electrode, and being operated at a temperature substantially equal to T, its emitter electrode being connected to said point of reference potential through said second resistance, and its base electrode being connected to the first end of said first resistance;

a current amplifier having an input terminal to which the collector electrode of said third transistor is direct coupled and an output terminal direct coupled to the first end of said first resistance.

8. A combination as set forth in claim 5 wherein said means responsive to said absolute temperature T for applying a potential proportional to T across said second resistance and said means for supplying a second current applied to said first parallel combination together comprise:

said second resistance being a portion of said first resistance having a first end at the first end of said first resistance and having a second end at a point intermediate the first and second ends of said first resistance;

a third transistor of said same conductivity type having base and emitter electrodes with a base-emitter junction therebetween having a collector electrode, and being operated at a temperature substantially equal to T, the emitter electrode of said third transistor being directly connected to said point of reference potential without substantial intervening impedance and its base electrode being connected to the second end of said second resistance; and a current amplifier having an input terminal to which the collector electrode of said third transistor is direct coupled and having an output terminal direct coupled to the first ends of said first and second resistances.

9. A combination as set forth in claim 5, wherein said means responsive to said absolute temperature T for applying a potential proportional to T across said second resistance, and said means for supplying a second current applied to said first parallel combination together comprise:

a third transistor of the same conductivity type as said first and second transistors, and fourth and fifth transistors of the opposite conductivity type, each having base and emitter electrodes with a base-emitter junction therebetween, each having a collector electrode, and each being operated at a temperature substantially equal to T, the base electrode of said third transistor having the first end of said first resistance connected thereto, and the emitter electrode of said third transistor being directly connected to said point of reference potential;

means for applying the emitter-to-collector potential of said fourth transistor across its base-emitter junction thereby making it a self-biased transistor, which self-biased transistor is serially connected with said second resistance to form a second series combination, said second series combination being connected in parallel with the base-emitter junction of said fifth transistor to form a second parallel combination;

sixth and seventh transistors respectively of the same conductivity type as said first and second and third transistors and of said opposite conductivity type, each having an input electrode and having a principal conduction path between a common electrode and an output electrode, the collector electrode of said third transistor and the output electrode of said seventh transistor being direct coupled to the input electrode of said sixth transistor, the collector electrode of said fifth transistor and the output electrode of said sixth transistor being direct coupled to the input electrode of said seventh transistor, the common electrode of said sixth transistor being direct coupled to the first end of said first resistance, and the common electrode of said seventh transistor being direct coupled to the end of said second parallel combination to which the base electrode of said fifth transistor connects; and means for applying an operating potential, as referred to said reference potential, to the end of said second parallel combination to which the emitter electrode of said fifth transistor connects.

10. A combination as set forth in claim 5, wherein said means responsive to said absolute temperature T for applying a potential proportional to T across said second resistance, and said means for supplying a second current applied to said first parallel combination together comprise:

a third transistor of the same conductivity type as said first and second transistors, and fourth and fifth transistors of the opposite conductivity type, each having base and emitter electrodes with a base-emitter junction therebetween, each having a collector electrode, and each being operated at a temperature substantially equal to T, the base electrode of said third transistor having the first end of said first resistance connected thereto, the emitter electrode of said third transistor being directly connected to said point of reference potential, and said second resistance being directly connected at first and second ends thereof respectively to the emitter electrode of said fourth transistor and to the emitter electrode of said fifth transistor;

a sixth transistor of the same conductivity type as said first and second and third transistors having an input electrode to which the collector electrodes of said third and said fifth transistors are direct coupled and having a principal conduction path between a common and an output electrode, its common electrode direct coupled to the first end of said first resistance and its output electrode direct coupled together with the collector electrode of said fourth transistor to the base electrodes of said fourth and said fifth transistors; and means for applying an operating potential, as referred to said reference potential, to the interconnected emitter electrode of said fifth transistor and second end of said second resistance.

11. A combination as set forth in claim 5 wherein said means responsive to said absolute temperature T for applying a potential proportional to T across said second resistance, and said means for supplying a second current applied to said first parallel combination together comprise:

a third transistor of the same conductivity type as said first and second transistors, and fourth and fifth transistors of the opposite conductivity type, each having base and emitter electrodes with a base-emitter junction therebetween, each having a collector electrode, and each being operated at a temperature substantially equal to T, the base electrode of said third transistor having the first end of said first resistance connected thereto, and the emitter electrode of said third transistor being directly connected to said point of reference potential, said second resistance being connected at a first end thereof to the base electrode of said fourth transistor and at a second end thereof to the collector electrode of said fourth transistor and to the base electrode of said fifth transistor;

means for applying an operating potential, as referred to said reference potential, to a node to which the emitter electrodes of said fourth and fifth transistors are each directly connected without substantial intervening impedance; and a sixth transistor of the same conductivity type as said first and second and third transistors, having an input electrode to which the collector electrodes of said third and fifth transistors are direct coupled and having a principal conduction path between common and output electrodes, its common electrode direct coupled to the first end of said first resistance and its output electrode direct coupled to the first end of said second resistance.

12. A combination as set forth in claim 5 wherein said means responsive to said absolute temperature T for applying a potential proportional to T across said second resistance, and said means for supplying a second current applied to said first parallel combination together comprise:

a third transistor of the same conductivity type as said first and second transistors, and fourth and fifth transistors of the opposite conductivity type, each having base and emitter electrodes with a base-emitter junction therebetween, each having a collector electrode and each being operated at a temperature substantially equal to T, the base electrode of said third transistor having the first end of said first resistance connected thereto, and the emitter electrode of said third transistor being directly connected to said point of reference potential;

means for applying the emitter-to-collector potential of said fourth transistor across its base-emitter junction thereby making it a self-biased transistor which self-biased transistor is serially connected with said second resistance to form a second serial combination, said second serial combination being connected in parallel with the base-emitter junction of said fifth transistor to form a second parallel combination;

a sixth transistor of said opposite conductivity type, having an input electrode to which the collector electrodes of said third and fifth transistors are direct coupled and having a principal conduction path between a common electrode and an output electrode, its common electrode being direct coupled to the end of said second parallel combination to which the base electrode of said fifth transistor is connected and its output electrode being direct coupled to the first end of said first resistance;

means for applying an operating potential, as referred to said reference potential, to the end of said second parallel combination to which the emitter electrode of said fifth transistor connects.

13. A combination as set forth in claim 5 wherein said means responsive to said absolute temperature T for applying a potential proportional to T across said second resistance, and said means for supplying a second current applied to said first parallel combination together comprise:

a third transistor of the same conductivity type as said first and second transistors, and fourth and fifth transistors of the opposite conductivity type, each having base and emitter electrodes with a base-emitter junction therebetween, each having a collector electrode, and each being operated at a temperature substantially equal to T, the base electrode of said third transistor having the first end of said first resistance connected thereto, the emitter electrode of said third transistor being directly connected to said point of reference potential, the collector electrode of said third transistor being direct coupled together with the collector electrode of said fourth transistor to the base electrodes of said fourth and said fifth transistors, the collector electrode of said fifth transistor being direct coupled to the first end of said first resistance, and said second resistance being directly connected at first and second ends thereof respectively to the emitter electrode of said fourth transistor and to the emitter electrode of said fifth transistor; and means for applying an operating potential, as referred to said reference potential, to the interconnected emitter electrode of said fifth transistor and said second end of said second resistance.

14. A combination as set forth in claim 5 wherein said means responsive to said absolute temperature T for applying a potential proportional to T across said second resistance, and said means for supplying a second current applied to said first parallel combination together comprise:

a third transistor of the same conductivity type as said first and second transistors, and fourth and fifth transistors of the opposite conductivity type, each having base and emitter electrodes with a base-emitter junction therebetween, each having a collector electrode, and each being operated at a temperature substantially equal to T, the base electrode of said third transistor having the first end of said first resistance connected thereto, the emitter electrode of said third transistor being directly connected to said point of reference potential, the collector electrode of said third transistor being directly coupled to the first end of said second resistance, the collector electrode of said fifth transistor being direct coupled to the first end of said first resistance, said second resistance being connected at a first end thereof to the base electrode of said fourth transistor and at a second end thereof to the collector electrode of said fourth transistor and to the base electrode of said fifth transistor; and means for applying an operating potential, as referred to said reference potential, to a node to which the emitter electrodes of said fourth and fifth transistors are directly connected without substantial intervening impedance.

15. A combination as set forth in claim 1 wherein said input transistor is said first transistor and said output transistor is said second transistor, whereby the collector current of said output transistor is larger than the collector current of said input transistor by an amount substantially equal to said substantially fixed proportion.

16. A combination as set forth in claim 15 wherein said first resistance consists of serially connected portions, one of which is said second resistance and wherein said means responsive to said absolute temperature T for applying a potential proportional to T across said second resistance, and said means for supplying a second current applied to said first parallel combination together further comprise:

a third transistor of the same conductivity type as said input transistor, having base and emitter electrodes with a base-emitter junction therebetween, having a collector electrode, and being operated at a temperature substantially equal to T, the emitter electrode of said third transistor being directly connected to a point of reference potential without substantial intervening impedance, the base electrodes of said input and said third transistors being connected to opposite ends of said second resistance;

a fourth transistor of the same conductivity type as said input transistor, having an input electrode to which the collector electrode of said third transistor is direct coupled, and having a principal conduction path between a common electrode and an output electrode, said common electrode being direct coupled to the base electrode of said output transistor; and a current amplifier having an input terminal to which the output electrode of said fourth transistor is direct coupled and having an output terminal direct coupled to the input electrode of said fourth transistor.

17. A combination as set forth in claim 15 wherein said input and said output transistors are of the same conductivity type, the emitter electrodes of said input and said output transistors are directly connected without substantial intervening impedance to a point of reference potential, and said first resistance is connected at a first end thereof to the base electrode of said input transistor and at a second end thereof to the base electrode of said output transistor.

18. A combination as set forth in claim 17 wherein said means responsive to said absolute temperature T for applying a potential proportional to T across said second resistance, and said means for supplying a second current applied to said first parallel combination together comprise:
   a third transistor of the same conductivity type as said input transistor, having base and emitter electrodes with a base-emitter junction therebetween, having a collector electrode, and being operated at a temperature substantially equal to T, its emitter electrode being connected to said point of reference potential through said second resistance, and its base electrode being connected to the first end of said first resistance;
   a current amplifier having an input terminal to which the collector electrode of said third transistor is direct coupled and an output terminal direct coupled to the second end of said first resistance.

19. A combination as set forth in claim 17 wherein the direct coupling of the collector electrode of said input transistor to the base electrode of said first transistor is through said second resistance as well as said first resistance, said second resistance having a first end connected to the base electrode of said first transistor and having a second end connected to the collector electrode of said input transistor, and wherein said means responsive to said absolute temperature T for applying a potential proportional to T across said second resistance, and said means for supplying a second current applied to said first parallel combination together comprise:
   a third transistor of the same conductivity type having base and emitter electrodes with a base-emitter junction therebetween, having a collector electrode, and being operated at a temperature substantially equal to T, the emitter electrode of said third transistor being directly connected to said point of reference potential without substantial intervening impedance and its base electrode being connected to the second end of said second resistance; and
   a current amplifier having an input terminal to which the collector electrode of said third transistor is direct coupled and having an output terminal direct coupled to the second end of said first resistance.

20. A combination as set forth in claim 17, wherein said means responsive to said absolute temperature T for supplying a potential proportional to T across said second resistance, and said means for supplying a second current applied to said first parallel combination together comprise:
   a third transistor of the same conductivity type as said first and second transistors, and fourth and fifth transistors of the opposite conductivity type, each having base and emitter electrodes with a base-emitter junction therebetween, each having a collector electrode, and each being operated at a temperature substantially equal to T, the base electrode of said third transistor having the first end of said first resistance connected thereto, and the emitter electrode of said third transistor being directly connected to said point of reference potential;
   means for applying the emitter-to-collector potential of said fourth transistor across its base-emitter junction thereby making it a self-biased transistor, which self-biased transistor is serially connected with said second resistance in a second series combination, which series combination is connected in a second parallel combination with the base-emitter junction of said fifth transistor;
   sixth and seventh transistors respectively of the same conductivity type as said first and second and third transistors and of said opposite conductivity type, each having an input electrode and having a principal conduction path between a common electrode and an output electrode, the collector electrode of said third transistor and the output electrode of said seventh transistor being direct coupled to the input electrode of said sixth transistor, the collector electrode of said fifth transistor and the output electrode of said sixth transistor being direct coupled to the input electrode of said seventh transistor, the common electrode of said sixth transistor being direct coupled to the second end of said first resistance, and the common electrode of said seventh transistor being direct coupled to the end of said second parallel combination to which the base electrode of said fifth transistor connects; and
   means for applying an operating potential, as referred to said reference potential, to the end of said second parallel combination to which the emitter electrode of said fifth transistor connects.

21. A combination as set forth in claim 17, wherein said means responsive to said absolute temperature T for applying a potential proportional to T across said second resistance, and said means for supplying a second current applied to said first parallel combination together comprise:
   a third transistor of the same conductivity type as said first and second transistors, and fourth and fifth transistors of the opposite conductivity type, each having base and emitter electrodes with a base-emitter junction therebetween, each having a collector electrode, and each being operated at a temperature substantially equal to T, the base electrode of said third transistor having the first end of said first resistance connected thereto, the emitter electrode of said third transistor being directly connected to said point of reference potential, and said second resistance being directly connected at first and second ends thereof respectively to the emitter electrode of said fourth transistor and to the emitter electrode of said fifth transistor;
   a sixth transistor of the same conductivity type as said first and second and third transistors having an input electrode to which the collector electrodes of said third and said fifth transistors are direct coupled and having a principal conduction path between a common and an output electrode, its common electrode direct coupled to the second end of said first resistance and its output electrode direct coupled together with the collector electrode of said fourth transistor to the base electrodes of said fourth and said fifth transistors; and
   means for applying an operating potential, as referred to said reference potential, to the interconnected emitter electrodes of said fifth transistor and second end of said second resistance.

22. A combination as set forth in claim 17, wherein said means responsive to said absolute temperature T for applying a potential proportional to T across said second resistance, and said means for supplying a second current applied to said first parallel combination together comprise:

- a third transistor of the same conductivity type as said first and second transistors, and fourth and fifth transistors of the opposite conductivity type, each having base and emitter electrodes with a base-emitter junction therebetween, each having a collector electrode, and each being operated at a temperature substantially equal to T, the base electrode of said third transistor having the first end of said first resistance connected thereto, and the emitter electrode of said third transistor being directly connected to said point of reference potential, said second resistance being connected at a first end thereof to the base electrode of said fourth transistor and at a second end thereof to the collector electrode of said fourth transistor and to the base electrode of said fifth transistor;
- means for applying an operating potential, as referred to said reference potential, to a node to which the emitter electrodes of said fourth and fifth transistors are each directly connected without substantial intervening impedance; and
- a sixth transistor of the same conductivity type as said first and second and third transistors, having an input electrode to which the collector electrodes of said third and fifth transistors are direct coupled and having a principal conduction path between common and output electrodes, its common electrode direct coupled to the second end of said first resistance and its output electrode direct coupled to the first end of said second resistance.

23. A combination as set forth in claim 17 wherein said means responsive to said absolute temperature T for applying a potential proportional to T across said second resistance, and said means for supplying a second current applied to said first parallel combination together comprise:

- a third transistor of the same conductivity type as said first and second transistors, and fourth and fifth transistors of the opposite conductivity type, each having base and emitter electrodes with a base-emitter junction therebetween, each having a collector electrode and each being operated at a temperature substantially equal to T, the base electrode of said third transistor having the first end of said resistance connected thereto, and the emitter electrode of said third transistor being directly connected to said point of reference potential;
- means for applying the emitter-to-collector potential of said fourth transistor across its base-emitter junction thereby making it a self-biased transistor which self-biased transistor is serially connected with said second resistance in a second serial combination, which second serial combination is connected in a second parallel combination with a base-emitter junction of said fifth transistor;
- a sixth transistor of said opposite conductivity type, having an input electrode to which the collector electrodes of said third and fifth transistors are direct coupled and having a principal conduction path between a common electrode and an output electrode, its common electrode being direct coupled to the end of said second parallel combination to which the base electrode of said fifth transistor is connected and its output electrode being direct coupled to the second end of said first resistance; and
- means for applying an operating potential, as referred to said reference potential, to the end of said second parallel combination to which the emitter electrode of said fifth transistor connects.

24. A combination as set forth in claim 17 wherein said means responsive to said absolute temperature T for applying a potential proportional to T across said second resistance, and said means for supplying a second current applied to said first parallel combination together comprise:

- a third transistor of the same conductivity type as said first and second transistors, and fourth and fifth transistors of the opposite conductivity type, each having base and emitter electrodes with a base-emitter junction therebetween, each having a collector electrode, and each being operated at a temperature substantially equal to T, the base electrode of said third transistor having the first end of said first resistance connected thereto, the emitter electrode of said third transistor being directly connected to said point of reference potential, the collector electrode of said third transistor direct coupled together with the collector electrode of said fourth transistor to the base electrodes of said fourth and fifth transistors, and the collector electrode of said fifth transistor being direct coupled to the second end of said first resistance and said second resistance being directly connected at first and second ends thereof respectively to the emitter electrode of said fourth transistor and to the emitter electrode of said fifth transistor; and
- means for applying an operating potential as referred to said reference potential to the interconnected emitter electrode of said fourth transistor and said first end of said second resistance.

25. A combination as set forth in claim 17 wherein said means responsive to said absolute temperature T for applying a potential proportional to T across said second resistance, and said means for supplying a second current applied to said first parallel combination together comprise:

- a third transistor of the same conductivity type as said first and second transistors, and fourth and fifth transistors of the opposite conductivity type, each having base and emitter electrodes with a base-emitter junction therebetween, each having a collector electrode, and each being operated at a temperature substantially equal to T, the base electrode of said third transistor having the first end of said first resistance connected thereto, the emitter electrode of said third transistor being directly connected to said point of reference potential, the collector electrode of said third transistor being directly coupled to the first end of said second resistance, and the collector electrode of said fifth transistor being direct coupled to the second end of said first resistance, and said second resistance being connected at a first end thereof to the base electrode of said fourth transistor and at a second end thereof to the collector electrode of said fourth transistor and to the base electrode of said fifth transistor; and
- means for applying an operating potential, as referred to said reference potential, to a node to which the emitter electrodes of said fourth and fifth transistors are directly connected without substantial intervening impedance.

* * * * *